United States Patent
Yoneda

(10) Patent No.: US 9,627,593 B2
(45) Date of Patent: Apr. 18, 2017

(54) MANUFACTURING METHOD OF LIGHT-EMITTING DEVICE

(71) Applicant: NICHIA CORPORATION, Anan-shi, Tokushima (JP)

(72) Inventor: Akinori Yoneda, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/757,541

(22) Filed: Dec. 23, 2015

(65) Prior Publication Data

US 2016/0190404 A1 Jun. 30, 2016

(30) Foreign Application Priority Data

Dec. 26, 2014 (JP) ................. 2014-266774

(51) Int. Cl.
*H01L 33/52* (2010.01)
*H01S 5/02* (2006.01)
*H01S 5/022* (2006.01)
*H01S 5/323* (2006.01)
*H01L 33/54* (2010.01)

(52) U.S. Cl.
CPC .............. *H01L 33/52* (2013.01); *H01L 33/54* (2013.01); *H01L 2933/005* (2013.01); *H01S 5/0201* (2013.01); *H01S 5/0213* (2013.01); *H01S 5/0217* (2013.01); *H01S 5/02228* (2013.01); *H01S 5/32341* (2013.01)

(58) Field of Classification Search
CPC ....................................... H01L 33/52
See application file for complete search history.

(56) References Cited

U.S. PATENT DOCUMENTS

| 2004/0195576 A1* | 10/2004 | Watanabe ............... H01L 33/62 257/79 |
| 2009/0022198 A1* | 1/2009 | Chen .................... H01L 31/0203 372/49.01 |
| 2010/0059782 A1* | 3/2010 | Fujitomo .............. H01L 33/486 257/98 |

(Continued)

FOREIGN PATENT DOCUMENTS

| JP | 2003-059555 | 2/2003 |
| JP | 2009-027166 | 2/2009 |

(Continued)

*Primary Examiner* — Calvin Choi
*Assistant Examiner* — S. M. S Imtiaz
(74) *Attorney, Agent, or Firm* — Foley & Lardner LLP

(57) ABSTRACT

A method of manufacturing a light-emitting device includes forming a separation layer on an upper surface of a supporting substrate; forming a plurality of external electrode layers on the separation layer; mounting a plurality of light-emitting elements on the external electrode layers; forming a plurality of resin layers between the supporting substrate and each of the light-emitting elements after mounting the light-emitting elements, the resin layers being formed such that the resin layers are separated from one another, and each resin layer underlies at least one light-emitting element; and applying laser light to the separation layer from a lower surface side of the supporting substrate, and separating the supporting substrate and the light-emitting elements from each other.

20 Claims, 25 Drawing Sheets

(56) References Cited

U.S. PATENT DOCUMENTS

| | | | |
|---|---|---|---|
| 2010/0096633 A1* | 4/2010 | Hatano | H01L 27/1214 257/59 |
| 2010/0098127 A1* | 4/2010 | Higuchi | H01S 5/18341 372/50.11 |
| 2010/0187542 A1* | 7/2010 | Ichihara | B82Y 20/00 257/76 |
| 2013/0217163 A1* | 8/2013 | Yoneda | H01L 33/32 438/33 |
| 2014/0273289 A1* | 9/2014 | Omura | H01L 33/0095 438/4 |
| 2014/0374786 A1* | 12/2014 | Bierhuizen | B29C 43/18 257/98 |

FOREIGN PATENT DOCUMENTS

| | | |
|---|---|---|
| JP | 2010-232643 | 10/2010 |
| JP | 2010-239105 | 10/2010 |
| JP | 4631232 B2 | 11/2010 |
| JP | 2014-179520 | 9/2014 |
| JP | 2015-0507371 | 3/2015 |

* cited by examiner

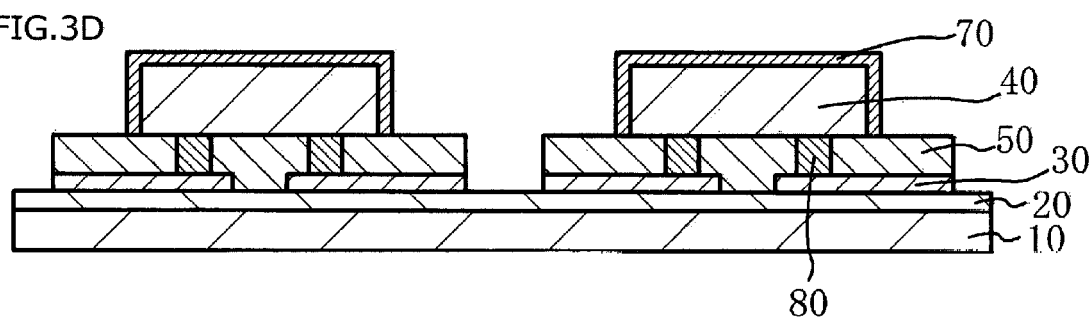

MANUFACTURING METHOD OF LIGHT-EMITTING DEVICE

CROSS-REFERENCE TO RELATED APPLICATION

This application claims priority to Japanese Patent Application No. 2014-266774, filed on Dec. 26, 2014. The entire disclosure of Japanese Patent Application No. 2014-266774 is hereby incorporated herein by reference.

TECHNICAL FIELD

The present disclosure relates to a manufacturing method of a light-emitting device.

BACKGROUND

A manufacturing method of a light-emitting device is known in which, after transferring a resin layer embedded with light emitting diode elements from a first temporary holding member to a second temporary holding member, a part of the resin layer is etched to form anode-side electrode pads on the light emitting diode elements. In this manufacturing method of a light-emitting device, after forming the electrode pads, the resin layer is divided for each light emitting diode element to separate into each resin chip corresponding to each light emitting diode element (Japanese Patent No. 4631232).

However, with the conventional manufacturing method described above, since the resin layer embedded with light emitting diode elements must be transferred from the first temporary holding member to the second temporary holding member, manufacturing processes increase and, accordingly, there is a risk that more product defects due to work errors may occur.

SUMMARY

The problem described above can be solved by, for example, the following method.

In one embodiment, a method of manufacturing a light-emitting device includes forming a separation layer on an upper surface of a supporting substrate; forming a plurality of external electrode layers on the separation layer; mounting a plurality of light-emitting elements on the external electrode layers; forming a plurality of resin layers between the supporting substrate and each of the light-emitting elements after mounting the light-emitting elements, the resin layers being formed such that the resin layers are separated from one another, and each resin layer underlies at least one light-emitting element; and applying laser light to the separation layer from a lower surface side of the supporting substrate, and separating the supporting substrate and the light-emitting elements from each other.

In another embodiment, a method of manufacturing a light-emitting device includes forming a separation layer on an upper surface of a supporting substrate; forming a plurality of external electrode layers on the separation layer; forming a plurality of resin layers on the external electrode layers such that a conductive member connected to the external electrode layers is exposed, the resin layers being formed so as to be separated from one another; mounting a plurality of light-emitting elements on the resin layers such that each resin layer underlies at least one light-emitting element; and applying laser light to the separation layer from a lower surface side of the supporting substrate, and separating the supporting substrate and the light-emitting elements from each other.

According to the manufacturing method of a light-emitting device described above, a manufacturing method of a light-emitting device with good mass productivity and manufacturing yield can be provided.

BRIEF DESCRIPTION OF THE DRAWINGS

FIG. 3D is a diagram explaining the manufacturing method of a light-emitting device according to the first embodiment;

DETAILED DESCRIPTION

[Light-Emitting Device According to First Embodiment]

Figure 1:
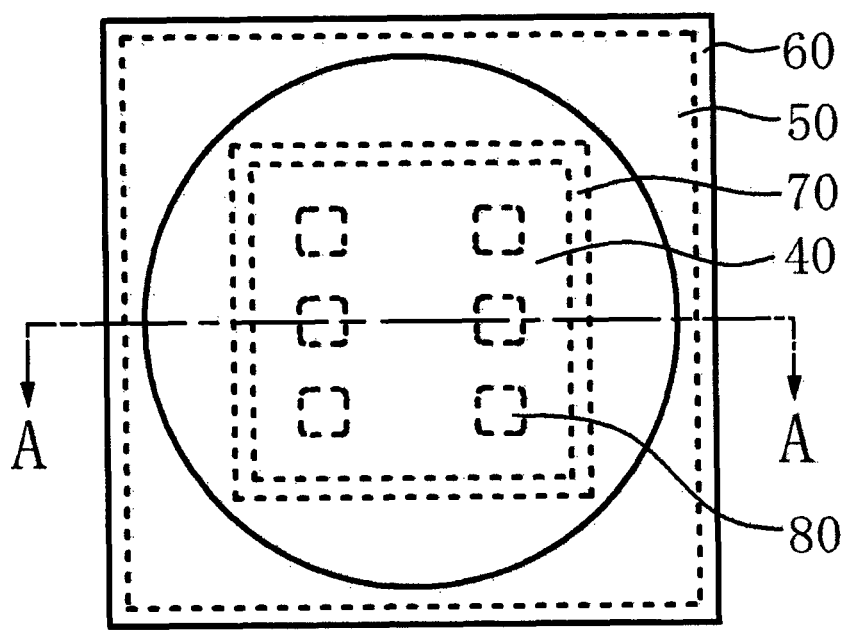
FIG. 1 is a schematic plan view of a light-emitting device according to a first embodiment.
Figure 2:
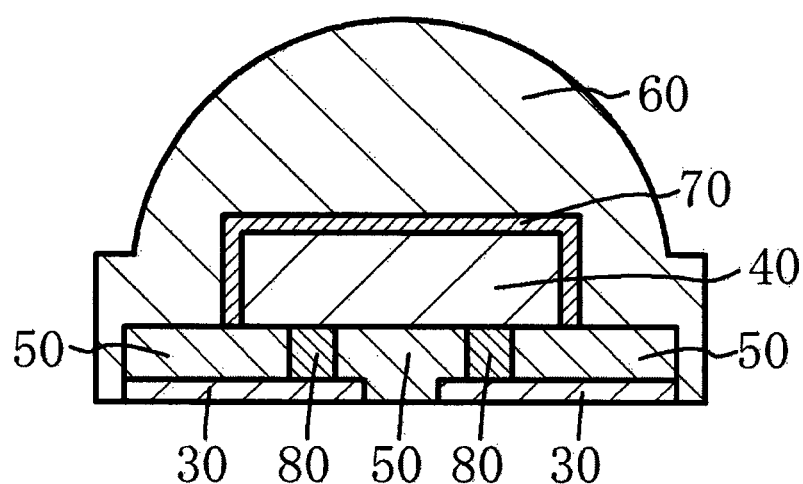
FIG. 2 is a schematic view showing a cross section taken along A-A in FIG. 1.

FIG. 1 is a schematic plan view of a light-emitting device according to a first embodiment, and FIG. 2 is a schematic view showing a cross section taken along A-A in FIG. 1. In FIG. 1, a light-emitting element 40, a resin layer 50, a lens member 60, a phosphor layer 70, and conductive members 80 are transparently shown using dashed lines. As shown in FIGS. 1 and 2, the light-emitting device according to the first embodiment includes an external electrode layer 30, the light-emitting element 40, and the resin layer 50.

The external electrode layer 30 is electrically connected to, for example, an electrode on a mounting substrate to which the light-emitting device is mounted. For example, Cu, Au, an alloy containing any of these metals as a main component, or the like can be used as the external electrode layer 30.

The light-emitting element 40 is arranged on the resin layer 50 and is electrically connected to the external electrode layer 30 via the conductive members 80. The conductive members 80 penetrate the resin layer 50. As the light-emitting element 40, for example, a light-emitting diode or a laser diode using a nitride semiconductor can be used. More specifically, a flip-chip light-emitting element which includes a pair of positive and negative electrodes on one of its surfaces and in which a surface opposite to the side provided with the electrodes functions as a main light extraction surface can be used as the light-emitting element 40.

The pair of positive and negative electrodes of the light-emitting element 40 are connected to a pair of external electrode layers 30, and the resin layer 50 is integrally arranged so as to straddle the pair of external electrode layers 30. As the resin layer 50, silicone resin, epoxy resin, or the like can be used. The resin layer 50 may contain granular light-scattering members made of $TiO_2$, $SiO_2$, or the like. By containing light-scattering members, light emitted to a side of the external electrode layer 30 from the light-emitting element 40 can be suitably reflected and light extraction efficiency of the light-emitting device can be improved. As shown in FIGS. 1 and 2, the light-emitting device may include the phosphor layer 70 that covers a surface of the light-emitting element 40. The light-emitting device may include the lens member 60 that is arranged so as to cover the light-emitting element 40.

[Method of Manufacturing Light-Emitting Device According to First Embodiment]

FIGS. 3A to 3G are diagrams explaining a manufacturing method of a light-emitting device according to the first embodiment. As shown in FIGS. 3A to 3G, the manufacturing method of a light-emitting device according to the first embodiment is a manufacturing method of a light-emitting device including the external electrode layers 30, the light-emitting element 40, and the resin layer 50, and includes the following processes. An orderly description will be given below.

(Forming Separation Layer)

Figure 3A:
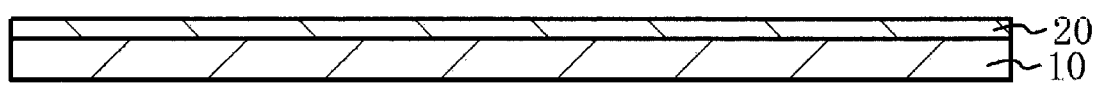
FIG. 3A is a diagram explaining a manufacturing method of a light-emitting device according to the first embodiment.

As shown in FIG. 3A, a separation layer 20 is formed on an upper surface of a supporting substrate 10. The separation layer 20 is preferably formed over a substantially entire surface on the supporting substrate 10. Accordingly, since the external electrode layers 30 can be efficiently patterned in an external electrode layer forming process to be described later, manufacturing yield can be improved.

As the supporting substrate 10, a member capable of transmitting laser light in a supporting substrate separating process to be described later is used. Preferably, a light transmissive sapphire substrate is used.

When the external electrode layer 30 is patterned by etching a resist pattern or the external electrode layer 30 in the external electrode layer forming process to be described later, the separation layer 20 is preferably an oxide layer highly resistant to etching. For example, niobium oxide or titanium oxide can be used as materials of the oxide layer. Accordingly, the external electrode layers 30 can be stably formed on the separation layer 20 in the external electrode layer forming process and manufacturing yield can be further improved.

The separation layer 20 can be formed by a sputtering method or the like.

The separation layer 20 preferably has a thickness in a range of, for example, 0.02 μm to 1 μm. Setting the thickness to 0.02 μm or more ensures sufficient resistance to etching, and setting the thickness to 1 μm or less reduces residues after decomposing the separation layer 20 in the supporting substrate separating process to be described later.

(Forming External Electrode Layer)

Figure 3B:
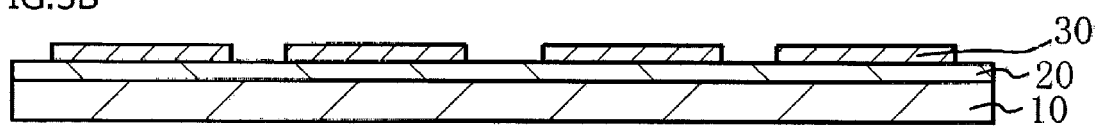
FIG. 3B is a diagram explaining the manufacturing method of a light-emitting device according to the first embodiment.

As shown in FIG. 3B, the external electrode layers 30 are formed on the separation layer 20. As described earlier, for example, the external electrode layers 30 can be patterned by etching. Specifically, for example, the external electrode layers 30 can be formed by methods such as (1) and (2) described below.

(1) The external electrode layers 30 are formed on the entire surface of the separation layer 20, and resist pattern is formed so as to cover areas where the external electrode layers 30 are to be arranged.

Next, the external electrode layers 30 are etched using the resist pattern as an etching mask and, subsequently, the resist pattern is removed.

(2) A resist pattern is formed on the separation layer 20 by a photolithographic method so as to include an opening at areas where the external electrode layers 30 are to be arranged. Next, the external electrode layers 30 are formed by a sputtering method, a vapor deposition method, or the like, and the external electrode layers 30 are patterned at a predetermined position by removing (i.e., lifting off) the resist pattern.

(Mounting Light-Emitting Element)

Figure 3C:
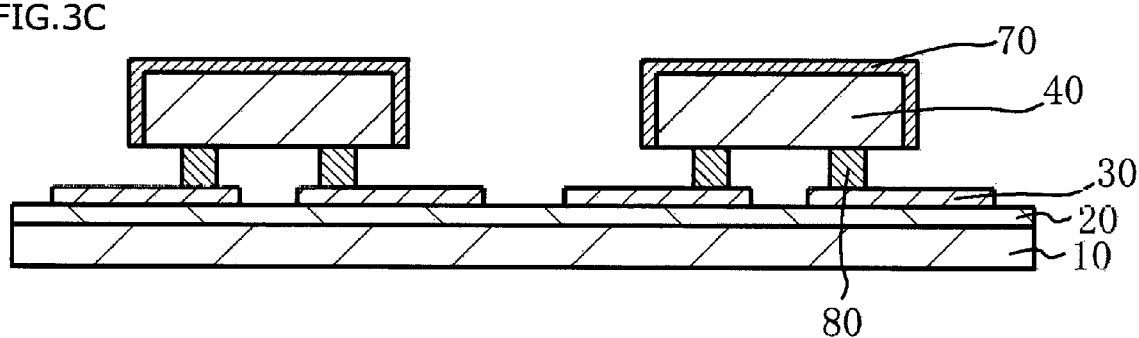
FIG. 3C is a diagram explaining the manufacturing method of a light-emitting device according to the first embodiment.

As shown in FIG. 3C, a plurality of the light-emitting elements 40 are mounted on the external electrode layers 30. An example method of mounting the light-emitting elements 40 is that the conductive members 80 made of Cu, Au or an alloy containing any of these metals as a main component, can be formed on the external electrode layers 30 and flip-chip light-emitting elements 40 can be provided electrically connected to the conductive members 80. Accordingly, the light-emitting elements 40 are electrically connected to the external electrode layers 30 via the conductive members 80.

The phosphor layer 70 including phosphor particles that absorb a part of light from the light-emitting elements 40, and which emits light with a wavelength different from that of the light from the light-emitting elements 40, may be formed on an upper surface and a side surface of the light-emitting elements 40. In addition, the phosphor layer 70 with a plate shape and includes phosphor particles may be arranged on surfaces of the light-emitting elements 40 that functions as light extraction surfaces via an adhesive member such as AuSn. As the phosphor material, a YAG based phosphor that emits yellow light, green light, or the like is preferably used. By forming the phosphor layer 70 on the surfaces of the light-emitting elements 40, for example, white light that is mixed color light of the light (for example, blue light or violet light) from the light-emitting elements 40 and the light from the phosphor can be extracted from the light-emitting device. The phosphor layer 70 can be formed on the surfaces of the light-emitting elements 40 by an electrodeposition method, an IPS method, or the like. In addition, as the plate-like phosphor layer 70, for example, resin, glass, or ceramic containing phosphor particles can be used.

(Forming Resin Layer)

As shown in FIG. 3D, after the light-emitting element mounting process described above, the resin layers 50 are formed between the supporting substrate 10 and the light-emitting elements 40. The resin layers 50 can be formed such that each resin layer 50 underlies at least one light-emitting element 40 and the resin layers 50 are separated from one another.

By also forming the resin layers 50 on the external electrode layers 30, absorption of light from the external electrode layer 30 can be reduced and light extraction efficiency can be further improved. The resin layers 50 also act to strengthen the light-emitting device and is capable of maintaining strength even in a state where the supporting substrate 10 is removed in the supporting substrate separating process to be described later. The resin layers 50 can be formed by, for example, forming a frame member made of resin so as to enclose n-number (n≥1) of light-emitting elements, placing resin in an area enclosed by the frame member, and hardening the resin.

The resin layers 50 are preferably formed by, for example, transfer molding or compression molding. Transfer molding enables the resin layers 50 with a desired shape to be accurately formed, or compression molding enables the resin layers 50 to be easily formed for each light-emitting element 40. In either case, manufacturing yield can be improved. In order to separate the resin layers 50 for each of the n-number (n≥1) of light-emitting elements 40, for example, after forming resists with spacing between the n-number (n≥1) of light-emitting elements 40, the resin layers 50 are integrally formed with respect to the n-number (n≥1) of light-emitting elements 40, and the resists are subsequently exposed and removed. In this case, for example, polyimide resin or the like can be used as the resists.

(Forming Lens Member)

Figure 3E:
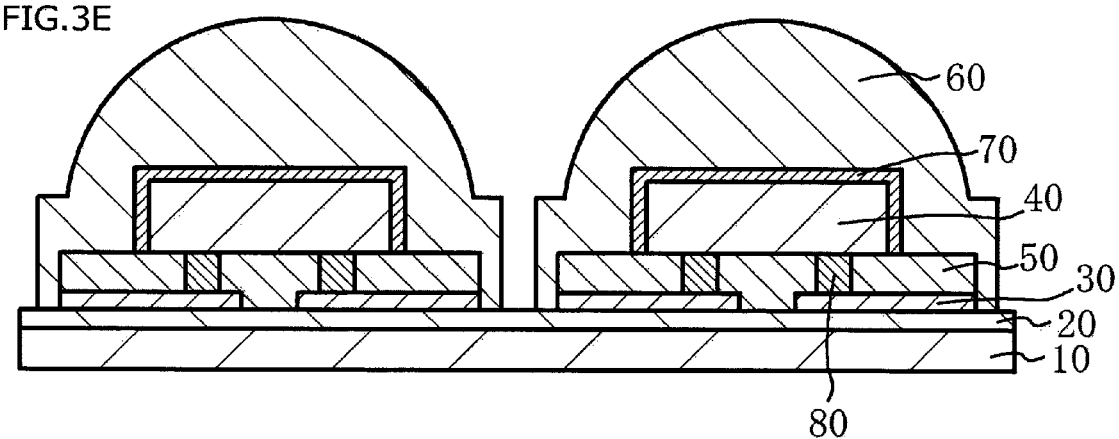
FIG. 3E is a diagram explaining the manufacturing method of a light-emitting device according to the first embodiment.

As shown in FIG. 3E, the lens member 60s are formed so as to cover the light-emitting device. As the lens members 60, various members can be used depending on optical characteristics of the light-emitting devices. For example, resin formed in a convex lens shape, a concave lens shape, or the like can be used. The lens members 60 can be formed by, for example, compression molding. At this point, in a similar manner to the resin layer forming process described earlier, the lens members 60 are preferably formed such that each lens member 60 covers at least one light-emitting element 40 and the lens members 60 are separated from one another. Accordingly, in the supporting substrate separating process to be described later, the respective light-emitting devices can be provided with the lens member 60 by separating the supporting substrate 10. This process is not essential and may be omitted as appropriate for the purpose of simplifying the processes.

(Separating Supporting Substrate)

Figure 3F:
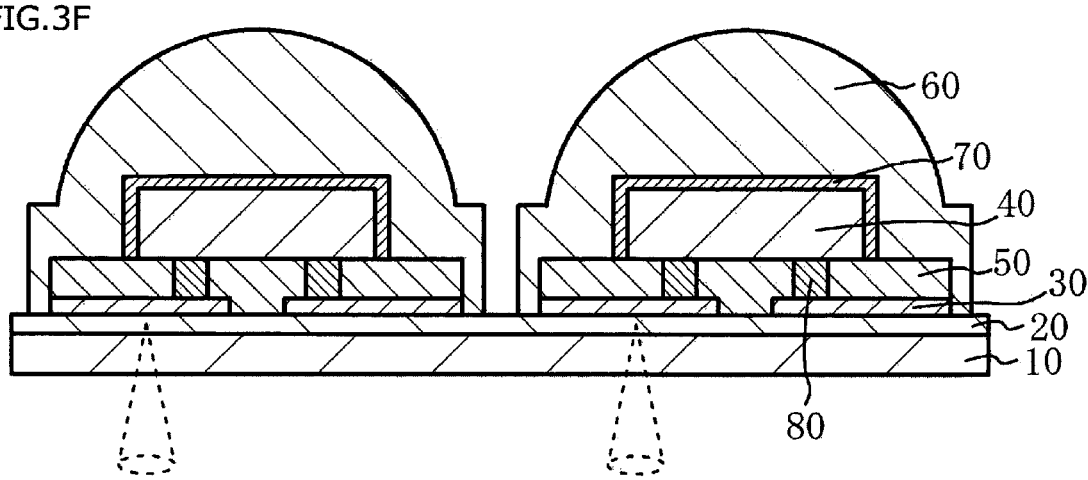
FIG. 3F is a diagram explaining the manufacturing method of a light-emitting device according to the first embodiment.
Figure 3G:
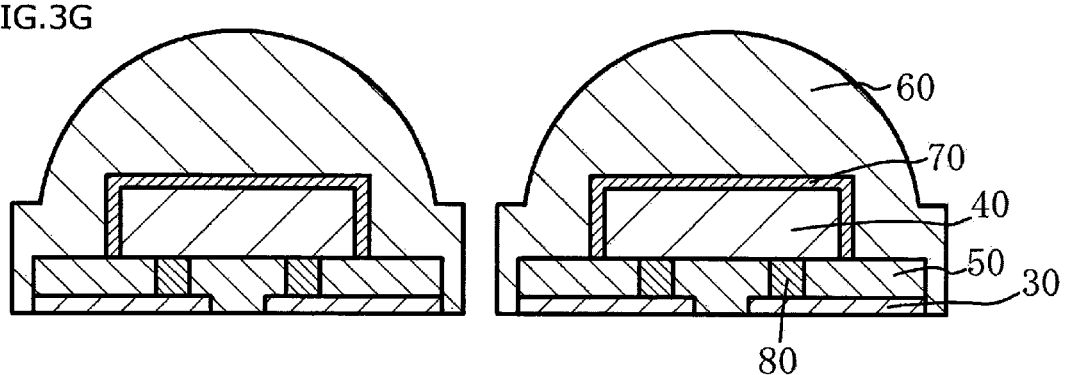
FIG. 3G is a diagram explaining the manufacturing method of a light-emitting device according to the first embodiment.

As shown in FIG. 3F, laser light is applied to the separation layer 20 from a lower surface side of the supporting substrate 10 and, as shown in FIG. 3G, the supporting substrate 10 and the light-emitting elements 40 are separated from each other. In other words, the separation layer 20 is removed from between the supporting substrate 10 and the light-emitting elements 40 by chemically decomposing the separation layer 20 by applying laser light. Accordingly, the supporting substrate 10 and the light-emitting elements 40 are separated from each other. Since the resin layers 50 are formed separated from one another as described earlier, the plurality of light-emitting devices are singulated by the present process. In this manner, according to the present embodiment, a plurality of light-emitting devices can be singulated without having to cut the supporting substrate 10 by laser dicing, blade dicing, or the like. Therefore, since the number of manufacturing processes can be reduced and work errors can be reduced, manufacturing yield can be improved. In addition, since the separated supporting substrate 10 can be reused as the supporting substrate 10 of another light-emitting device, mass productivity of light-emitting devices can also be improved. Furthermore, while a light-emitting device is subjected to loads when the supporting substrate 10 is cut, since the present embodiment does not require cutting the supporting substrate 10, such loads can be prevented from acting on a light-emitting device, and a light-emitting device with high reliability can be manufactured.

When using niobium oxide or titanium oxide as the separation layer 20, applying of laser light with a wavelength of 400 nm or less is preferable. Accordingly, the laser light can be absorbed more efficiently in the separation layer 20. As a result, since the separation layer 20 can be readily decomposed and the light-emitting elements 40 and the supporting substrate 10 can be efficiently separated from each other, mass productivity and manufacturing yield can be further improved. While the separation layer 20 may be completely removed from the resin layer 50 and the external electrode layer 30, the separation layer 20 may remain connected to the resin layer 50 as long as the external electrode layer 30 is exposed.

As described above, with the manufacturing method of a light-emitting device according to the first embodiment, since the light-emitting elements 40 need not be transferred from one supporting substrate 10 to another supporting substrate 10, and the resin layer 50 need not be etched in order to expose the external electrode layer 30, the number of processes required to manufacture the light-emitting device can be reduced. Accordingly, mass productivity and manufacturing yield can be improved. Therefore, with to the manufacturing method of a light-emitting device according to the first embodiment, a manufacturing method of a light-emitting device with good mass productivity and manufacturing yield can be provided.

[Light-Emitting Device According to Second Embodiment]

Figure 4:
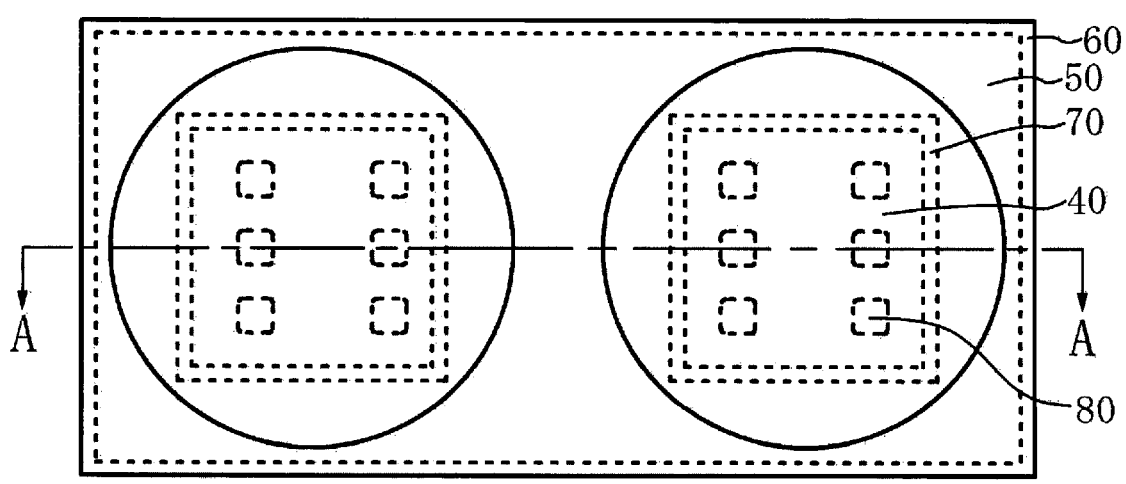
FIG. 4 is a schematic plan view of a light-emitting device according to a second embodiment.
Figure 5:
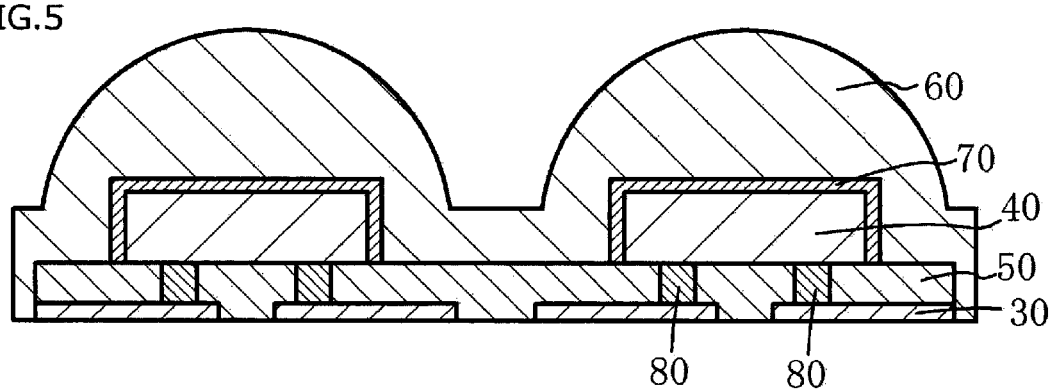
FIG. 5 is a schematic view showing a cross section taken along A-A in FIG. 4.
Figure 6A:
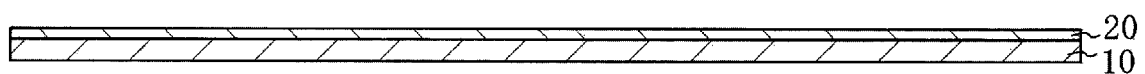
FIG. 6A is a diagram explaining a manufacturing method of a light-emitting device according to the second embodiment.
Figure 6B:
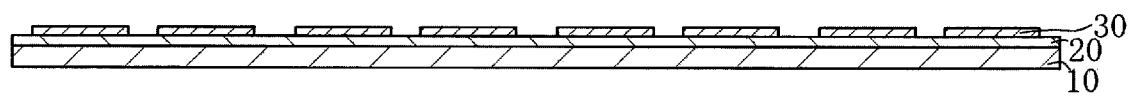
FIG. 6B is a diagram explaining the manufacturing method of a light-emitting device according to the second embodiment.
Figure 6C:
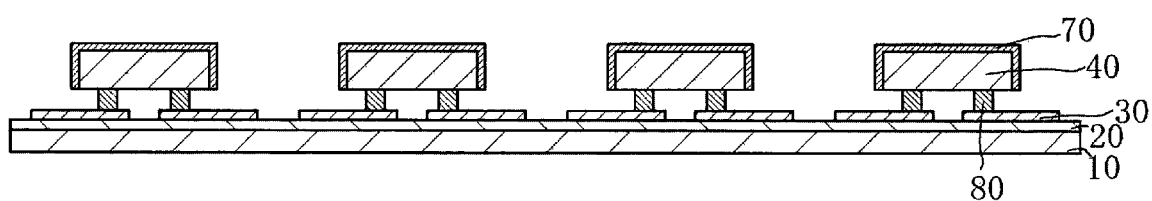
FIG. 6C is a diagram explaining the manufacturing method of a light-emitting device according to the second embodiment.
Figure 6D:
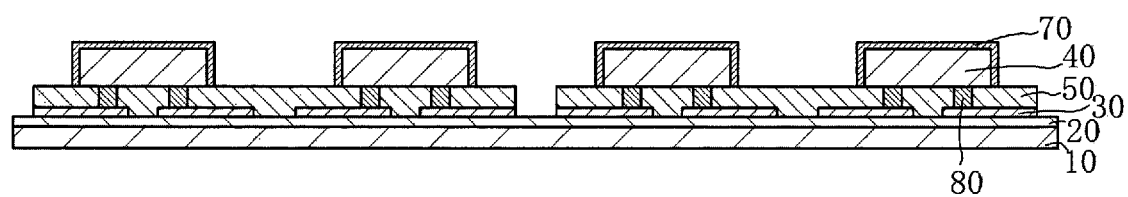
FIG. 6D is a diagram explaining the manufacturing method of a light-emitting device according to the second embodiment.
Figure 6E:
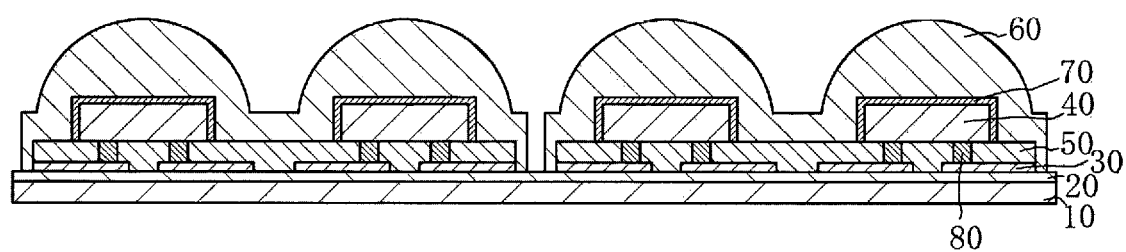
FIG. 6E is a diagram explaining the manufacturing method of a light-emitting device according to the second embodiment.
Figure 6F:
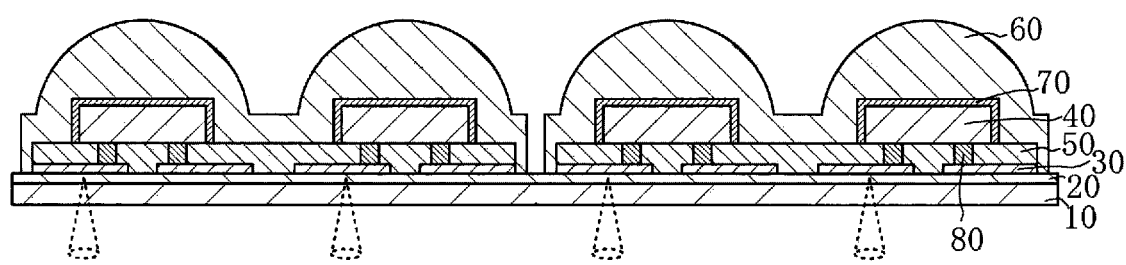
FIG. 6F is a diagram explaining the manufacturing method of a light-emitting device according to the second embodiment.
Figure 6G:
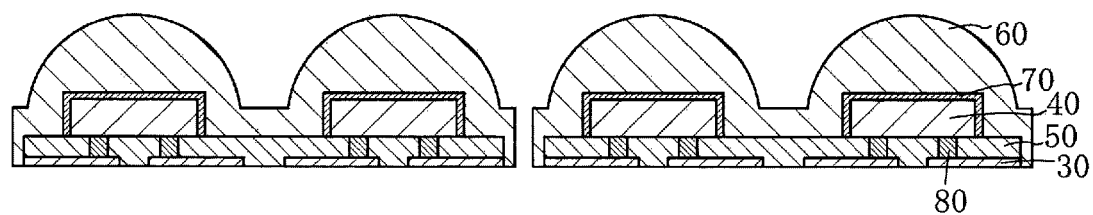
FIG. 6G is a diagram explaining the manufacturing method of a light-emitting device according to the second embodiment.

FIG. 4 is a schematic plan view of a light-emitting device according to a second embodiment, and FIG. 5 is a schematic view showing a cross section taken along A-A in FIG.

4. In FIG. 4, light-emitting elements 40, the resin layer 50, the lens member 60, the phosphor layer 70, and the conductive members 80 are transparently shown using dashed lines. As shown in FIGS. 4 and 5, the light-emitting device according to the second embodiment is the same as the light-emitting device according to the first embodiment except that, in the second embodiment, the resin layers 50 are formed so as to be separated from one another and each underlies two or more light-emitting elements 40, while, in the first embodiment, the resin layers 50 are formed so as to be separated from one another and each underlies at least one light-emitting element 40 in that. With the second embodiment, the resin layers 50 may be formed so as to be separated from one another and each underlies at least one light-emitting element 40 or may be formed so as to be separated from one another and each underlies two or more light-emitting elements 40. In the case where the resin layers 50 are formed so as to be separated from one another and each underlies at least one light-emitting element 40, the resin layers 50 are integrally arranged so as to straddle a plurality of external electrode layers 30 to which one light-emitting element 40 is electrically connected as shown in FIGS. 1 and 2. On the other hand, in the case where the resin layers 50 are formed so as to be separated from one another and each underlies two or more light-emitting elements 40, the resin layers 50 are integrally arranged so as to straddle a plurality of external electrode layers 30 to which two or more light-emitting elements 40 are electrically connected as shown in FIGS. 4 and 5.

[Method of Manufacturing Light-Emitting Device According to Second Embodiment]

FIGS. 6A to 6G are diagrams explaining a manufacturing method of a light-emitting device according to the second embodiment. As shown in FIGS. 6A to 6G, the manufacturing method of a light-emitting device according to the second embodiment differs in the resin layer forming process from the manufacturing method of a light-emitting device according to the first embodiment. In the second embodiment, the resin layers 50 are formed so as to be separated from one another and each underlies two or more light-emitting elements 40, while, in the first embodiment, the resin layers 50 are formed so as to be separated from one another each underlies at least one light-emitting element 40. With the manufacturing method of a light-emitting device according to the second embodiment, a manufacturing method of a light-emitting device with good mass productivity and manufacturing yield can be provided as well as the manufacturing method of a light-emitting device according to the first embodiment.

[Method of Manufacturing Light-Emitting Device According to Third Embodiment]

FIGS. 7A to 7G are diagrams explaining a manufacturing method of a light-emitting device according to the third embodiment. As shown in FIGS. 7A to 7G, the manufacturing method of a light-emitting device according to the third embodiment is similar to the method of manufacturing the light-emitting device according to the first embodiment except that the resin layers 50, which include the conductive members 80, before the light-emitting element mounting process, are formed so as to be separated from one another and are positioned so as to underlie at least one light-emitting element 40 on a side of the external electrode layer 30 on which the light-emitting elements 40 are mounted (refer to FIG. 7C), while, in the first embodiment, the resin layers 50, after the light-emitting element mounting process, are formed between the supporting substrate 10 and the light-emitting element 40 so as to be separated from one another and each underlies at least one light-emitting element 40 (refer to FIG. 3C). The conductive members 80 are connected to the external electrode layer 30 on an opposite side to a side of the resin layers 50 on which the light-emitting elements 40 are mounted, and are exposed from the resin layers 50 on the side of the resin layers 50 on which the light-emitting elements 40 are mounted. As described above, the resin layers 50 can be formed after the light-emitting element mounting process or before the light-emitting element mounting process.

In the manufacturing method of a light-emitting device according to the third embodiment, specifically, the resin layers 50 can be formed by processes (1) to (3) described below.

(1) First, before the light-emitting element mounting process, a metal plated layer constituting the conductive members 80 is formed on the external electrode layer 30 by an electroplating method or the like.

(2) Next, the resin layers 50 are formed, separated from one another and positioned such that they each underlie at least one light-emitting element 40 when the light-emitting elements 40 are mounted, so as to cover the conductive members 80. Accordingly, the resin layers 50 having the conductive members 80 inside thereof are formed.

Figure 7A:
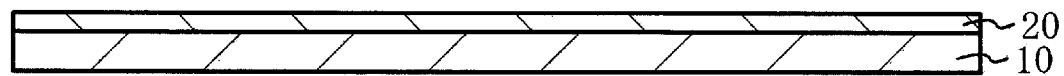
FIG. 7A is a diagram explaining a manufacturing method of a light-emitting device according to a third embodiment.
Figure 7B:
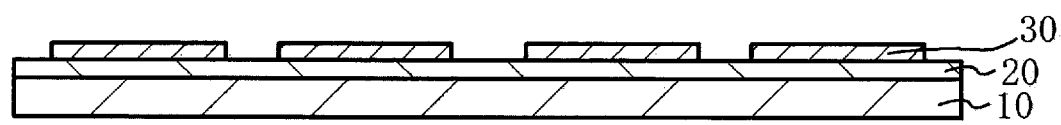
FIG. 7B is a diagram explaining the manufacturing method of a light-emitting device according to the third embodiment.
Figure 7C:
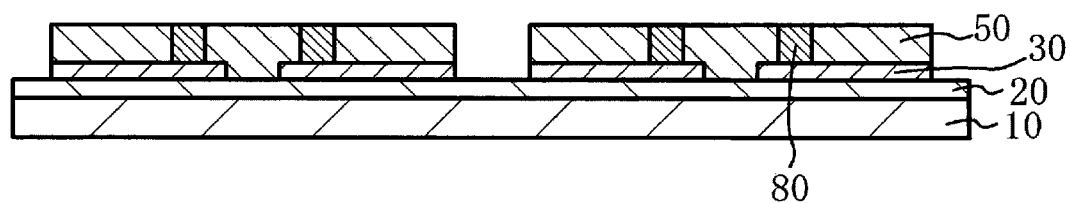
FIG. 7C is a diagram explaining the manufacturing method of a light-emitting device according to the third embodiment.

(3) Next, the resin layers 50 are removed from the side of the surface on which the light-emitting elements 40 are mounted. Accordingly, as shown in FIG. 7C, the conductive members 80 are exposed from a side of the resin layer 50 on which the light-emitting elements 40 are mounted.

Figure 7D:
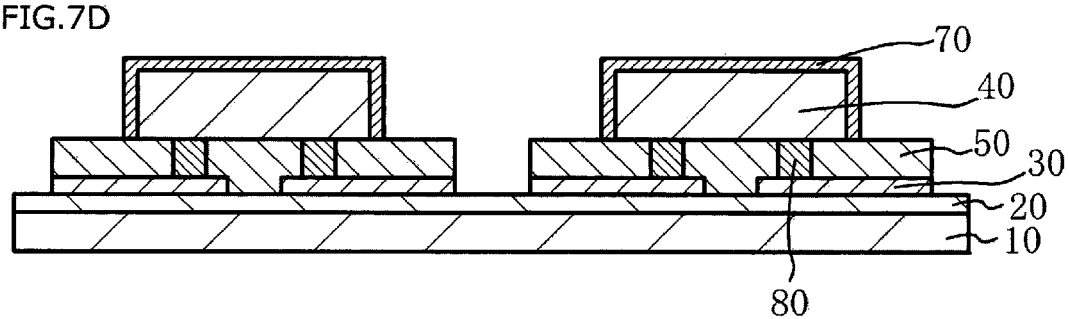
FIG. 7D is a diagram explaining the manufacturing method of a light-emitting device according to the third embodiment.
Figure 7E:
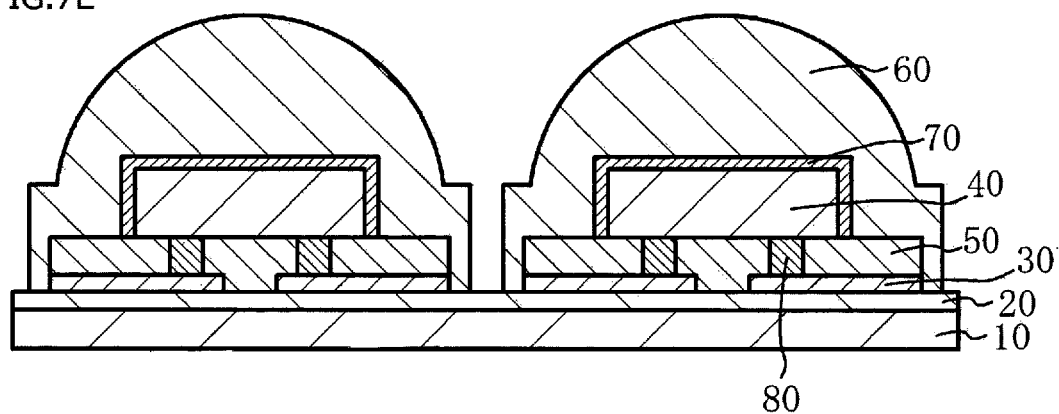
FIG. 7E is a diagram explaining the manufacturing method of a light-emitting device according to the third embodiment.
Figure 7F:
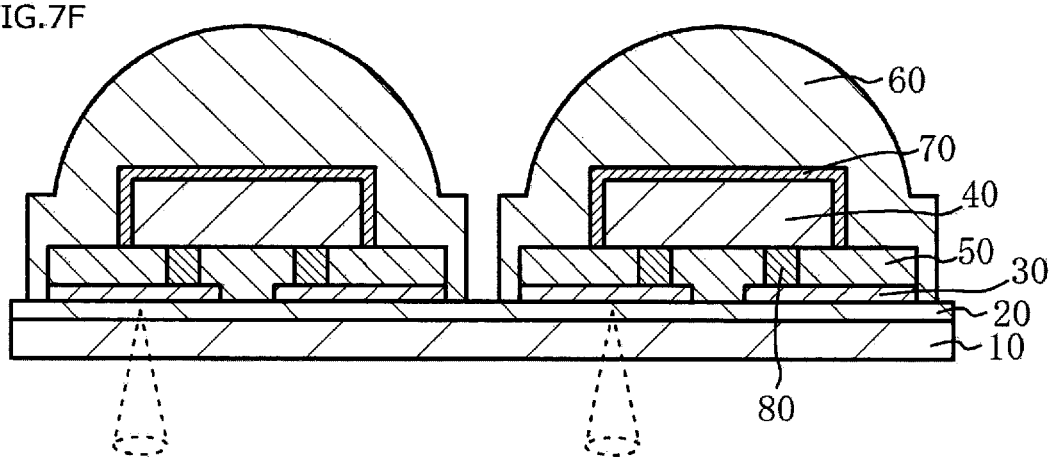
FIG. 7F is a diagram explaining the manufacturing method of a light-emitting device according to the third embodiment.
Figure 7G:
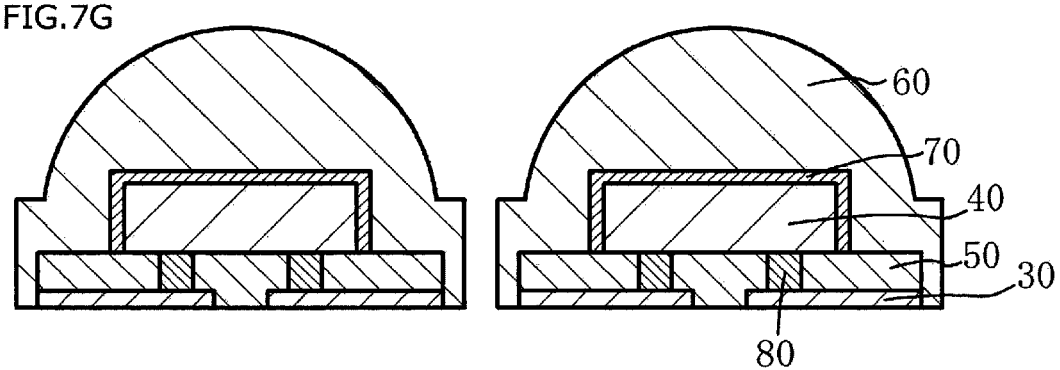
FIG. 7G is a diagram explaining the manufacturing method of a light-emitting device according to the third embodiment.

After forming the resin layers 50 as described above, in the light-emitting element mounting processes shown in FIG. 7D, by electrically connecting the light-emitting elements 40 to the metal plated layer (i.e., the conductive members 80) exposed from the resin layers 50, the light-emitting elements 40 are electrically connected to the external electrode layer 30 via the metal plated layer (i.e., the conductive members 80). Alternatively, the light-emitting elements 40 and the metal plated layer (i.e., the conductive members 80) may be connected to each other via a connecting member such as AuSn.

While embodiments of the present invention has been described above, it is to be understood that the description is merely exemplary and does not limit the invention as set forth in the appended claims in any way whatsoever.

What is claimed is:

1. A method of manufacturing a light-emitting device, the method comprising:
   forming a separation layer on an upper surface of a supporting substrate;
   forming a plurality of external electrode layers on the separation layer;
   mounting a plurality of light-emitting elements on the external electrode layers;
   forming a plurality of resin layers between the supporting substrate and each of the light-emitting elements after mounting the light-emitting elements, the resin layers being formed such that the resin layers are separated from one another, and each resin layer underlies at least one light-emitting element; and
   applying laser light to the separation layer from a lower surface side of the supporting substrate, and separating the supporting substrate and the light-emitting elements from each other.

2. A method of manufacturing a light-emitting device, the method comprising:
   forming a separation layer on an upper surface of a supporting substrate;

forming a plurality of external electrode layers on the separation layer;

forming a plurality of resin layers on the external electrode layers such that a conductive member connected to the external electrode layers is exposed, the resin layers being formed so as to be separated from one another;

mounting a plurality of light-emitting elements on the resin layers such that each resin layer underlies at least one light-emitting element; and applying laser light to the separation layer from a lower surface side of the supporting substrate, and separating the supporting substrate and the light-emitting elements from each other.

3. The method according to claim 1, wherein, in the step of forming the resin layers, the resin layers are formed so such that the resin layers are separated from one another, and each resin layer underlies two or more light-emitting elements.

4. The method according to claim 2, wherein, in the step of mounting the plurality of light-emitting elements on the resin layers, the plurality of light-emitting elements are mounted on the resin layers such that each resin layer underlies two or more light-emitting elements.

5. The method according to claim 1, wherein
the separation layer is made of niobium oxide or titanium oxide, and
in the step of forming the external electrode layer, the external electrode layer is patterned by etching.

6. The method according to claim 2, wherein
the separation layer is made of niobium oxide or titanium oxide, and
in the step of forming the external electrode layer, the external electrode layer is patterned by etching.

7. The method according to claim 1, wherein the supporting substrate is a sapphire substrate.

8. The method according to claim 2, wherein the supporting substrate is a sapphire substrate.

9. The method according to claim 5, wherein the supporting substrate is a sapphire substrate.

10. The method according to claim 6, wherein the supporting substrate is a sapphire substrate.

11. The method according to claim 1, wherein, in the step of forming the resin layers, the resin layers are formed by transfer molding.

12. The method according to claim 2, wherein, in the step of forming the resin layers, the resin layers are formed by transfer molding.

13. The method according to claim 1, wherein, in the step of forming the resin layers, the resin layers are formed by compression molding.

14. The method according to claim 2, wherein, in the step of forming the resin layers, the resin layers are formed by compression molding.

15. The method according to claim 1, wherein the step of forming the resin layers comprises forming at least one resist such that at least part of the at least one resist is between at least two light-emitting elements, integrally forming an at least one resin layer underlying at least one of the two light-emitting elements, and subsequently exposing and removing the resist.

16. The method according to claim 2, wherein the step of forming the resin layers comprises forming at least one resist such that at least part of the at least one resist is between at least two light-emitting elements, integrally forming an at least one resin layer underlying at least one of the two light-emitting elements, and removing the resist.

17. The method according to claim 1, wherein, in the step of forming the separation layer, the separation layer is formed with a thickness in a range of 0.02 µm to 1 µm.

18. The method according to claim 2, wherein, in the step of forming the separation layer, the separation layer is formed with a thickness in a range of 0.02 µm to 1 µm.

19. The method according to claim 5, wherein, in the step of forming the separation layer, the separation layer is formed with a thickness in a range of 0.02 µm to 1 µm.

20. The method according to claim 6, wherein, in the step of forming the separation layer, the separation layer is formed with a thickness in a range of 0.02 µm to 1 µm.

* * * * *